United States Patent
Barone

(10) Patent No.: US 7,143,327 B2
(45) Date of Patent: Nov. 28, 2006

(54) METHOD AND SYSTEM FOR COMPRESSING REPETITIVE DATA, IN PARTICULAR DATA USED IN MEMORY DEVICE TESTING

(75) Inventor: Massimiliano Barone, Via Toselli (IT)

(73) Assignee: STMicroelectronics, S.r.l. (IT)

( * ) Notice: Subject to any disclaimer, the term of this patent is extended or adjusted under 35 U.S.C. 154(b) by 422 days.

(21) Appl. No.: 10/698,037

(22) Filed: Oct. 29, 2003

(65) Prior Publication Data

US 2004/0177295 A1    Sep. 9, 2004

(30) Foreign Application Priority Data

Oct. 30, 2002    (EP)    ................... 02425660

(51) Int. Cl.
*G01R 31/28*    (2006.01)
(52) U.S. Cl. .................................... 714/738
(58) Field of Classification Search ................ 714/718, 714/719, 738, 724; 341/51
See application file for complete search history.

(56) References Cited

U.S. PATENT DOCUMENTS

| | | | | |
|---|---|---|---|---|
| 4,054,951 A | | 10/1977 | Jackson et al. ............. 364/900 |
| 6,360,340 B1 | | 3/2002 | Brown et al. ............... 714/718 |
| 6,416,410 B1 * | | 7/2002 | Abou-Samra et al. ........ 463/31 |
| 6,684,358 B1 * | | 1/2004 | Rajski et al. ............... 714/739 |

FOREIGN PATENT DOCUMENTS

| | | |
|---|---|---|
| DE | WO 00/69179 | 11/2000 |
| EP | 93480076.4 | 6/1993 |

OTHER PUBLICATIONS

European Search Report, EP02425660, Mar. 11, 2003.
Yamaguchi, Takahiro, et al., An Efficient Method For Compressing Test Data, XP-000800314, International Test Conference, 1997.

* cited by examiner

*Primary Examiner*—James C Kerveros
(74) *Attorney, Agent, or Firm*—Lisa K. Jorgenson; Graybeal Jackson Haley LLP; Paul F. Rusyn

(57) ABSTRACT

Described herein is a method for compressing a sequence of repetitive data, which uses in combination one or more words with a format for non-compressible data and one or more words with a format for compressible data, in which a word with a format for non-compressible data is made up of a set of bits, in which the most significant bit is set at the logic value "1" and the remaining bits are the bits of a non-compressible datum to be encoded, whilst a word with a format for compressible data is made up of a set of bits, in which the most significant bit is set at a the logic value "0", the next five most significant bits indicate the total number of subsequent words which encode the sequence of repetitive data, and the remaining eleven bits indicate the number of times that the words indicated by the preceding five most significant bits are repeated.

22 Claims, 4 Drawing Sheets

| 0 | 10 | 10 |

Fig. 5a

| 0 | 4 | 7 |

Fig. 5b

| 0 | 1 | 5 |

Fig. 5c

| 1 | A |

Fig. 5d

| 0 | 1 | 6 |

Fig. 5e

| 1 | B |

Fig. 5f

| 0 | 4 | 6 |

Fig. 5g

| 0 | 1 | 3 |

Fig. 5h

| 1 | C |

Fig. 5i

| 0 | 1 | 4 |

Fig. 5j

| 1 | D |

Fig. 5k

METHOD AND SYSTEM FOR COMPRESSING REPETITIVE DATA, IN PARTICULAR DATA USED IN MEMORY DEVICE TESTING

PRIORITY CLAIM

This application claims priority from European patent application No. 02425660.4, filed Oct. 30, 2002, which is incorporated herein by reference.

TECHNICAL FIELD

The present invention relates to a method for compressing repetitive data. In particular, the present invention finds advantageous, but non-exclusive, application in the compression of data used in memory device testing, to which the ensuing treatment will make explicit reference without, however, this implying any loss in generality.

BACKGROUND

As is known, a memory device testing basically involves execution of two types of operations: verifying possible read fails, which, as is known, are caused by defects that are eliminated by resorting to redundancy elements purposely provided in the memory device design stage, and, in the event of read fails being detected, analysing such fails so as to perform a sort of screening of the defects that arise during the manufacture of the memory device.

Read fail analysis basically envisages executing three operations: storing in the memory device a bitmap having a regular pattern, for example, a bitmap containing all zeros or all ones, or else all zeros except for a diagonal of ones, alternating zeros and ones (checkerboard pattern), etc., then reading the bitmap from the memory device, and, finally, analysing the deviation of the bitmap from the stored bitmap.

Read fail analysis, as well as verify of the possible presence of read fails, is performed using a tester connected on one side to the memory device to be tested and on the other side to a personal computer or a workstation.

FIG. 1 schematically illustrates by way of example the circuit arrangement for testing an embedded memory device, i.e., a memory device which, in use, is associated to an electronic device, typically a microcontroller or a dedicated logic, which sends to the memory device the addresses of the memory locations in which the data to be read are stored and acquires the data outputted by the latter.

In particular, in FIG. 1, the reference number 1 designates the embedded memory device; number 2 designates the memory to be tested forming part of the embedded memory device 1, which may be either of a nonvolatile type, for example a Flash memory, or of a volatile type, for example a static memory (SRAM) or a dynamic memory (DRAM); number 3 designates the microcontroller, which is associated to the memory 2 and also forms part of the embedded memory device 1; number 4 designates the tester; and finally number 5 designates the personal computer.

Tester 4 carries out autonomously the entire operation of verifying the possible presence of read fails, whilst, during the subsequent operation of read fail analysis, basically carries out the functions of accumulating the compressed data and generating a corresponding file, which is then supplied to the personal computer or to the workstation for a subsequent processing, for example, display or, if need be, a specific processing.

In detail, microprocessor 3 reads the state of the memory 2 and compresses the read data, and the compressed data are then stored in the internal memory of the microprocessor 3. When data compression is completed or the internal memory of the microprocessor 3 is full, a signal indicating this situation is generated by the microprocessor 3 and supplied to the tester 4, which reads from the internal memory of the microprocessor 3 the compressed data and saves them in a file. At the end of the operations, the file thus generated is supplied to the personal computer or to the workstation 5.

The testers 4 currently available on the market differ, among other things, basically for the speed with which they are able to supply to the personal computer 5 the data read from the memory device 2. In particular, amongst the testers currently available on the market, the ones which are operatively slower require even around 100 ms for supplying to the personal computer 5 even just one datum read, in so far as they use a serial communication protocol and have an extremely simple internal logic.

A very effective method that is currently used to increase the amount of data transmitted in unit time by the tester 4 to the personal computer 5 is represented by the implementation of the so-called data compression algorithms, the most widely used of which are essentially based upon the principle of sending to the personal computer just the bits or groups of bits for which a read fail has been verified and a corresponding address with respect to a reference bitmap.

The data compression algorithms based upon comparison of the bitmap read with a reference bitmap require first of all generation of the reference bitmap and their performances depend to a large extent upon the degree of "resemblance" of the bitmap read with the reference bitmap, and, in particular, their performances are satisfactory only in the case in which the bitmap read is not very different from the reference bitmap.

SUMMARY

An aim of the present invention is therefore to provide a data compression method that is not based upon the criterion of comparison between bitmaps.

According to one aspect of the present invention, a method is provided for compressing repetitive data, as defined in claim 1.

BRIEF DESCRIPTION OF THE DRAWINGS

For a better understanding of the present invention, there is now described a preferred embodiment, purely by way of non-limiting example and with reference to the attached drawings, in which:

FIGS. 5a to 5k show another example of the encoding of a sequence of repetitive data according to the first embodiment of the present invention;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
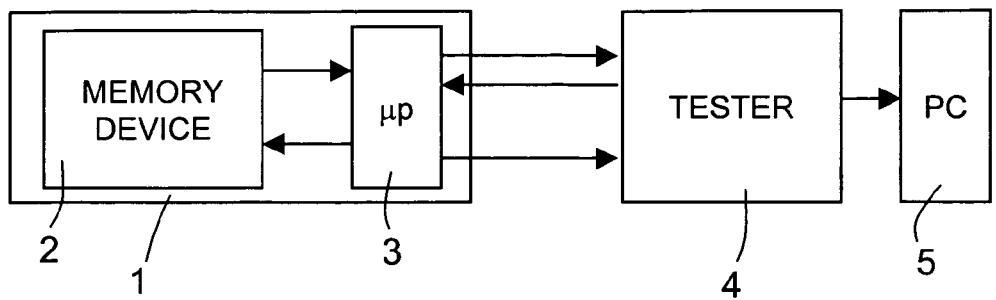
FIG. 1 schematically shows a circuit arrangement for testing an embedded memory device.
Figure 2A:
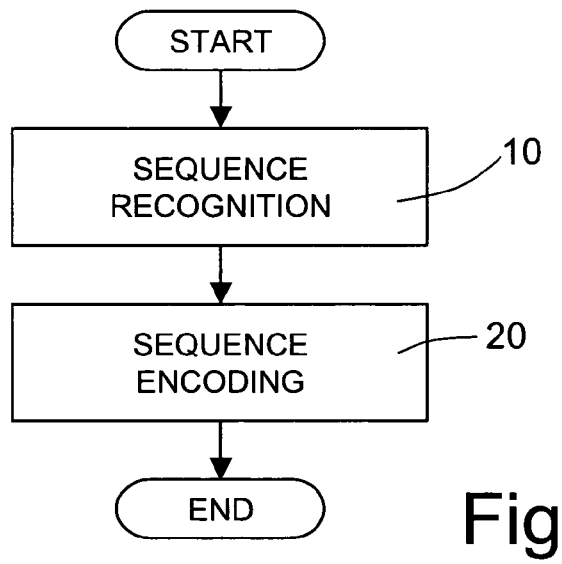
FIGS. 2a and 2b show flowcharts of a compression method according to one embodiment of the present invention.

As is illustrated in FIG. 2a, a compression method according to an embodiment of the present invention essentially envisages execution of two operations:

recognizing a sequence of repetitive data (block 10), whereby, as the data are read from the memory device under test, it is determined whether individual data or groups of data are repeated according to a sequence; and sequence encoding (block 20), whereby the recognized sequence of repetitive data or repetitive groups of data is appropriately encoded.

Figure 2B:
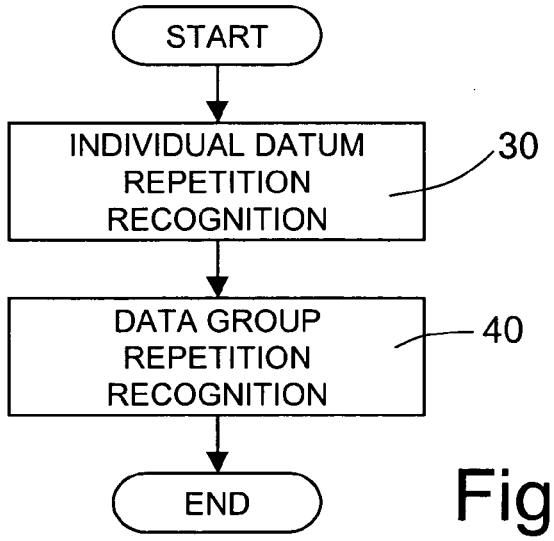

In particular, recognizing a sequence of repetitive data is carried out by means of a buffer having a given data storage capacity and, as is illustrated in FIG. 2b, basically envisages execution of two operations:

recognizing a repetition of an individual datum (block 30); and subsequently recognizing a repetition of groups of data (block 40).

As regards recognizing a repetition of an individual datum, each datum read from the memory device is stored temporarily in the buffer together with a counter indicating the number of times the datum is repeated.

Considering, for instance, 16-bit data, hereinafter represented for reasons of simplicity with the hexadecimal notation, if, for example, the data sequence AAA, BB, AAA, BB were read from the memory device, in the buffer there would be stored the datum "A" and a corresponding counter set at the value "3", then the datum "B" and a corresponding counter set at the value "2", then again the datum "A" and a corresponding counter set at the value "3", and finally again the datum "B" and a corresponding counter set at the value "2".

Based on the contents of the buffer, a possible repetition of groups of data is then recognized. In the example considered above, the presence of the repetition twice of the sequence consisting of the datum "A" that is repeated three times and of the datum "B" that is repeated twice is recognized.

As regards repetition encoding, this can be carried out in two different ways, based on the format of the compressed data that is to be obtained, and, in particular, based on whether the compressed data have or not the same length as the data to be compressed.

Figure 3A:
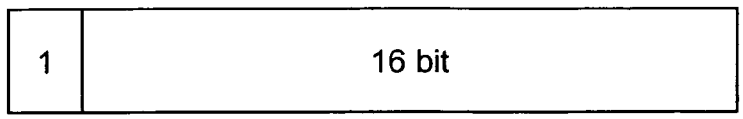
FIGS. 3a and 3b show data formats used in encoding a sequence of repetitive data according to a first embodiment of the present invention.
Figure 3B:

In particular, FIGS. 3a and 3b show two data formats used in encoding a data sequence according to a first embodiment of the present invention, in which the length of the compressed data is greater than the length of the non-compressed data and, in particular, the compressed data are longer than the non-compressed data by one bit. For reasons of simplicity, FIGS. 3a and 3b show the encoding of 16-bit data, it being however clear that what has been said can be applied in a similar manner to data of any length.

In particular, the encoding of a data sequence according to the first embodiment of the present invention is carried out using in combination one or more words with a format for non-compressible data and one or more words with a format for compressible data.

FIG. 3a shows a word having a format for non-compressible data. According to what is shown in FIG. 3a, a word having a format for non-compressible data is made up of seventeen bits defined as follows:

the most significant bit is set at the logic value "1"; and the remaining sixteen bits are the sixteen bits of the datum.

FIG. 3b illustrates, instead, a word having a format for compressible data. According to what is shown in FIG. 3b, a word having a format for compressible data is made up of seventeen bits defined as follows:

the most significant bit is set at the logic value "0";

the next five most significant bits indicate the total number of subsequent words that, together with the present word, encode the sequence of repetitive data; and the remaining eleven bits indicate the number of times the words indicated by the five bits referred to above are repeated.

Figure 4A:
FIGS. 4a, 4b, 4c, 4d and 4e show an example of the encoding of a sequence of repetitive data according to the first embodiment of the present invention.

In order to understand the modality with which the various words that encode a data sequence are generated, reference can be made to FIGS. 4a–4, which show the encoding of a data sequence that is repeated twenty-one times and is formed by the datum "0", which is repeated seven times, followed by the datum "53", which is repeated six times.

The encoding of the above data sequence requires the generation of five 17-bit words formed in the way described in what follows. The procedure for determining the number of words necessary for encoding a sequence will emerge more clearly from the following description.

The first word, shown in FIG. 4a, is used for indicating the total number of words that are needed to encode the data sequence and the number of repetitions of the sequence, and, in particular, has the following structure:

the most significant bit is set at the logic value "0" to indicate that the word belongs to the encoding of a compressed sequence;

the next five most significant bits indicate the total number of words following the present one, in the case in point four, which encode the repetition of the data sequence referred to above; and the remaining eleven bits indicate the number of repetitions, in the case in point twenty-one, of the words following the present one and indicated by the five bits referred to above, in the case in point four, which encode the repetition of the sequence.

Figure 4B:
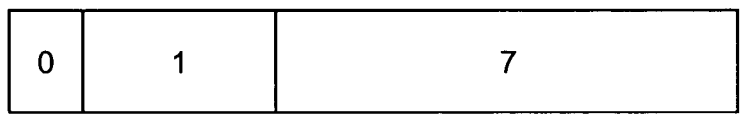
Figure 4C:
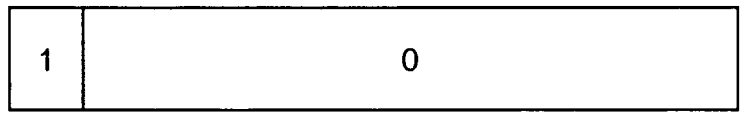

The second word and the third word, shown in FIGS. 4b and 4c, respectively, are used to encode the repetition of the datum "0". In particular, the second word indicates the number of words following it, which make up the encoding of the repetition of the datum "0" and the number of repetitions of said datum, and, in particular, has the following structure:

the most significant bit is set at the logic value "0" to indicate that the word belongs to the encoding of a compressed sequence;

the next five most significant bits indicate the number of words following the present one, in the case in point one, which encode the datum "0"; and the remaining eleven bits indicate the number of repetitions, in the case in point seven, of the words following the present one and the number of which is indicated by the five bits referred to above, in the case in point one, which encode the datum "0".

The third word represents the datum "0", and, in particular, has the following structure:

the most significant bit is set at the logic value "1" to indicate that the word belongs to the encoding of a non-compressed datum; and the next sixteen bits represent the datum "0".

Figure 4D:
Figure 4E:
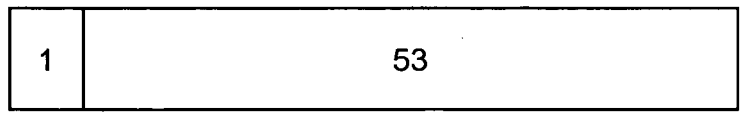

The fourth word and the fifth word, shown in FIGS. 4d and 4e, respectively, are used for encoding the repetition of the datum "53". In particular, the fourth word indicates the number of words following it, which make up the encoding of the repetition of the datum "53" and the number of repetitions of said datum, and, in particular, has the following structure:

the most significant bit is set at the logic value "0" to indicate that the word belongs to the encoding of a compressed datum;

the next five most significant bits indicate the number of words following the present one, in the case in point one, which encode the datum "53"; and the remaining eleven bits indicate the number of repetitions, in the case in point six, of the words following the present one and the number of which is indicated by the five bits referred to above, in the case in point one, which encode the datum "53".

The fifth word represents the datum "53", and, in particular, has the following structure:

the most significant bit is set at the logic value "1" to indicate that the word belongs to the encoding of a non-compressed datum;

the remaining sixteen bits represent the datum "53".

In brief, the third word represents the datum "0", whilst the second word indicates the number of times the datum represented in the third word is repeated, the fifth word represents the datum "53", whilst the fourth word indicates the number of times the datum represented in the fifth word is repeated, and finally the first word indicates the number of times the four subsequent words are repeated.

As may be noted, therefore, the words that make up the encoding of the data sequence repetition taken as example are arranged according to a nested structure, in which: the third and fifth words constitute the innermost nestings; the second and fourth words constitute the two intermediate nestings, which indicate the number of repetitions of the two innermost nestings, in particular, the first intermediate nesting being external to the first innermost nesting and indicating the number of repetitions of the latter, and the second intermediate nesting being external to the second innermost nesting and indicating the number of repetitions of the latter; finally, the first word constitutes the external nesting, which indicates the number of repetitions of the two intermediate nestings.

In particular, each innermost nesting is made up of a word representing a datum that is repeated, whereas the intermediate nesting external to this is made up of a word indicating, on the one hand, the number of subsequent words that make up the respective innermost nesting, generally a single word, and, on the other hand, the number of times the words that make up the respective innermost nesting are repeated.

In addition, whatever the nesting level, repetition of a nesting involves generation of a respective outer nesting formed by a word indicating, on the one hand, the number of subsequent words that make up the respective inner nesting and, on the other hand, the number of times the said words are repeated.

In order to further clarify what has been said above, another example is illustrated in FIGS. 5a–5k, which refer to the encoding of the following repetition of data sequence: {[A(5), B(6)](7), [C(3), D(4)](6)}(10), i.e., a data sequence that repeats in all ten times and is made up of two sub-sequences, in which the first sub-sequence is repeated seven times and is formed by the datum "A", which is repeated five times, and the datum "B", which is repeated six times, whilst the second sub-sequence is repeated six times and is formed by the datum "C", which is repeated three times, and the datum "D", which is repeated four times.

In accordance with the above description, to encode said repetition, in all eleven words are required, in which eight words are needed to encode the repetitions of the four data "A", "B", "C", and "D" (two words for encoding the repetition of each datum), one word is needed for encoding the repetition of the sub-sequence formed by the repetitions of "A" and "B", one word is needed for encoding the repetition of the sub-sequence formed by the repetitions of "C" and "D", and, finally, one word is needed for encoding the repetition of the sequence formed by the repetitions of the aforesaid sub-sequences.

As may be noted, the first word (FIG. 5a) indicates that the encoding of the entire sequence is made up of ten words in addition to the first word (for a total of eleven words) and that said words are repeated ten times (number of repetitions of the sequence), the words from the second to the sixth (FIGS. 5b–5f) regard the encoding of the first sub-sequence, whilst the words from the seventh to the eleventh (FIGS. 5g–5k) regard the encoding of the second sub-sequence.

As regards the first sub-sequence, the second word (FIG. 5b) indicates that the encoding is made up of four words in addition to the second one (for a total of five words) and that said words are repeated seven times (number of repetitions of the first sub-sequence), the third word and the fourth word (FIGS. 5c and 5d) regard the encoding of the repetition of the datum "A", whilst the fifth word and the sixth word (FIGS. 5e and 5f) regard the encoding of the datum "B". In particular, the third word (FIG. 5c) indicates that the encoding of the datum "A" is made up of one word in addition to the third word (for a total of two words) and that the following word is repeated five times (number of repetitions of the datum "A"), whilst the fourth word (FIG. 5d) indicates the datum "A", just as the fifth word (FIG. 5e) indicates that the encoding of the datum "B" is made up of one word in addition to the fifth word (for a total of two words) and that the following word is repeated six times (number of repetitions of the datum "B"), whilst the sixth word (FIG. 5f) indicates the datum "B"

As regards the second sub-sequence, the seventh word (FIG. 5g) indicates that the encoding is made up of four words in addition to the seventh (for a total of five words) and that said words are repeated six times (number of repetitions of the second sub-sequence), the eighth word and ninth word (FIGS. 5h and 5i) regard the encoding of the repetition of the datum "C", whilst the tenth word and the eleventh word (FIG. 5j and 5k) regard the encoding of the datum "D". In particular, the eighth word (FIG. 5h) indicates that the encoding of the datum "C" is made up of one word in addition to the eighth word (for a total of two words) and that the following word is repeated three times (number of repetitions of the datum "C"), whilst the ninth word (FIG. 5*i*) indicates the datum "C", just as the tenth word (FIG. 5*j*) indicates that the encoding of the datum "D" is made up of one word in addition to the tenth word (for a total of two words) and that the following word is repeated four times (number of repetitions of the datum "D"), whilst the eleventh word (FIG. 5*k*) indicates the datum "D".

FIGS. 6*a*, 6*b*, 6*c* and 6*d* illustrate, instead, the data formats used in the encoding of a data sequence according to a second embodiment of the present invention, in which the length of the compressed data is equal to the length of the non-compressed data. In a way similar to what has been said in regard to FIGS. 3*a* and 3*b*, FIGS. 6*a* to 6*d* illustrate the encoding of 16-bit data, it being however clear that what has been said can be applied in a similar manner to data of any length.

The encoding of a data sequence according to the second embodiment of the present invention differs from the encoding according to the first embodiment of the present invention in that a format for compressible data is used which is specific for encoding a sequence of zeros, i.e., a sequence of data the bits of which all assume a zero logic value, in so far as this is the most frequent datum in the memory device testing.

Figure 6A:
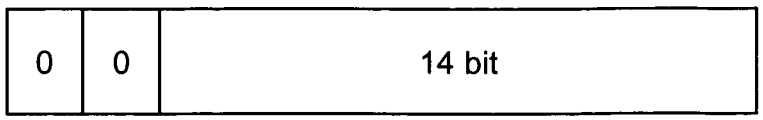
FIGS. 6a, 6b, 6c and 6d show data formats used in encoding a sequence of repetitive data according to a second embodiment of the present invention.

In particular, FIG. 6*a* shows a word having a data format specific for the encoding of a sequence of zeros. According to what is shown in FIG. 6*a*, the word having said specific data format is made up of sixteen bits defined as follows:

the two most significant bits are set at the logic value "0"; and the remaining fourteen bits indicate the number of subsequent data, the value of which is "0".

Figure 6B:
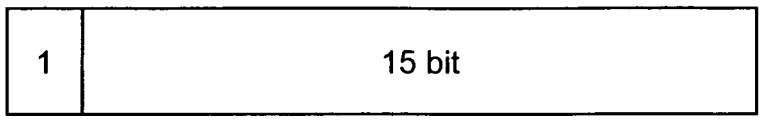

FIG. 6*b* illustrates, instead, a word having a format for non-compressible data. According to what is shown in FIG. 6*b*, the word having a format for non-compressible data is made up of sixteen bits defined as follows:

the most significant bit is set at the logic value "1"; and the remaining fifteen bits are the fifteen bits of the datum.

Figure 6C:
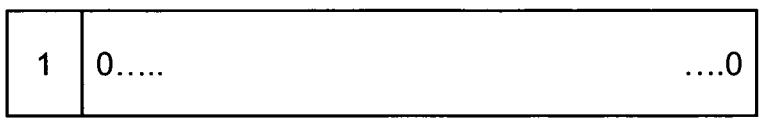

Furthermore, if the most significant bit of the datum coincides with the first bit of the encoded datum, i.e., "1", then a further word is generated as shown in FIG. 6*c*, which is defined as follows:

the most significant bit is set at the logic value "1"; and the remaining fifteen bits are set at the logic value "0".

If, instead, the most significant bit of the non-compressible datum is "0", then no further word is generated.

Figure 6D:
Figure 7A:
FIGS. 7a, 7b, 7c and 7d show an example of the encoding of a sequence of repetitive data according to the second embodiment of the present invention.
Figure 7B:
Figure 7C:
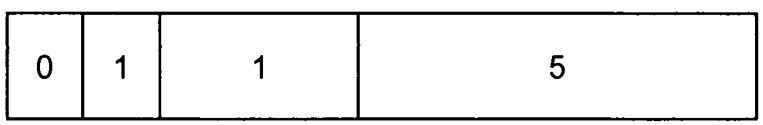
Figure 7D:
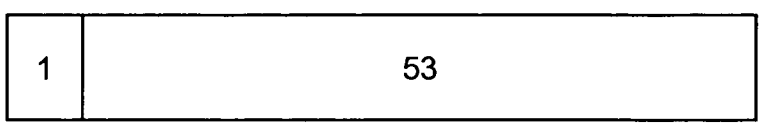

Finally, FIG. 6*d* illustrates a word having a format for compressible data. According to what is shown in FIG. 6*d*, the word having a format for compressible data is made up of sixteen bits defined as follows:

the most significant bit is set at the logic value "0", and the very next bit is set at the logic value "1";

the next four most significant bits indicate the total number of subsequent words, which, together with the first one, encode the repetition of the datum or of the sequence of data; and the remaining ten bits indicate the number of times minus one the words indicated by the four bits referred to above are repeated.

As may be noted, the format for compressible data used in the encoding according to the second embodiment of the present invention is very similar to the one used in the encoding according to the first embodiment of the present invention and differs from the latter simply in the composition of the various groups of bits As a comparative example of the encodings according to the two embodiments of the present invention, FIGS. 7*a*, 7*b*, 7*c* and 7*d* show the words used for encoding the same data sequence, the encoding of which, according to the first embodiment of the present invention, is illustrated in FIGS. 4*a* to 4*e*, i.e., a data sequence that is repeated twenty-one times and is formed by the datum "0", which is repeated seven times, followed by the datum "53", which is repeated six times.

As may be noted, the encoding is made up of four 16-bit words, in which the first word regards the encoding of the repetition of said sequence, the second word regards the encoding of the datum "0" which is repeated seven times, and the third word and the fourth word regard the encoding of the datum "53" which is repeated five times.

In particular, in the first word (FIG. 7*a*), the two most significant bits are set at the logic values "0" and "1" to indicate that the word belongs to the encoding of a compressed sequence, the next four most significant bits indicate the number of subsequent words belonging to the encoding, in the case in point three, and the remaining ten bits indicate the number of repetitions minus one of the subsequent three words, in the case in point twenty.

In the second word (FIG. 7*b*), the two most significant bits are set at the logic value "0" to indicate that it is the encoding of the repetition of the datum "0", whilst the remaining fourteen bits indicate the number of repetitions of the datum "0", in the case in point seven.

In the third word (FIG. 7*c*), instead, the two most significant bits are set at the logic values "0" and "1" to indicate that the word belongs to a compressed datum, the next four bits indicate the number of subsequent words that make up, together with the fourth word, the encoding of repetition of the datum "53", in the case in point one word, whilst the remaining ten bits indicate the number of repetitions of the following word minus one, in the case in point five.

Finally, in the fourth word (FIG. 7*d*), the most significant bit is set at the logic value "1" to indicate that it is a non-compressed datum, and the remaining fifteen bits indicate the datum "53".

The described compression methods and systems according to embodiments of the present invention may be utilized in a variety of different types of electronic systems. For example, the methods may be applied to systems for testing memory devices and may also be applied to communications systems or computer networks where the compression of digital data is desireable.

The advantages that the described embodiments of the present invention afford emerge clearly from the foregoing description.

Finally, it is clear that modifications and variations can be made to what is described and illustrated herein, without thereby departing from the scope of the present invention, as defined in the annexed claims.

The invention claimed is:

1. A method for compressing repetitive data, in particular data used in memory device testing, comprising the steps of:

recognizing a sequence of repetitive data and encoding said sequence of repetitive data, wherein the encoding of said sequence of repetitive data is obtained using in combination one or more words with a format for non-compressible data and one or more words with a format for compressible data, a word with a format for non-compressible data being made up of a set of bits, in which a specific bit is set at a first logic value and the remaining bits are formed by at least some of the bits of the non-compressible datum to be encoded, and a word with a format for compressible data being made up of a set of bits, in which, a specific bit is set at a second logic value different from said first logic value, a first set of bits indicates the total number of subsequent words, which, together with said word, encode said sequence of repetitive data, and a second set of bits indicates the number of times that the words indicated by said first set of bits are repeated.

2. The method according to claim 1, wherein said specific bit of a word with a format for non-compressible data is the most significant bit.

3. The method according to claim 1, wherein said specific bit of a word with a format for compressible data is the most significant bit.

4. The method according to claim 1, wherein said first set of bits of a word with a format for compressible data is formed by the bits following said specific bit.

5. The method according to claim 1, wherein said second set of bits of a word with a format for compressible data is formed by the bits subsequent to those of said first set of bits.

6. The method according to claim 1, wherein said remaining bits of a word with a format for non-compressible data are all the bits of the non-compressible datum to be encoded.

7. The method according to claim 1, wherein the remaining bits of a word with a format for non-compressible data are all the bits of the non-compressible datum to be encoded, except for a specific bit.

8. The method according to claim 7, wherein said specific bit of the non-compressible datum to be encoded is the most significant bit.

9. The method according to claim 7, wherein, in the case where said specific bit of the non-compressible datum to be encoded has a certain logic value, a further word is generated, which is formed by a set of bits in which a specific bit is set at said first logic value and the remaining bits are set at said second logic value.

10. The method according to claim 9, wherein said further word is generated in the case where said specific bit of the non-compressible datum to be encoded assumes said first logic value.

11. The method according to claim 9, wherein said specific bit of said further word is the most significant bit.

12. The method according to claim 7, wherein a word with a format for non-compressible data has a further specific bit set at said first logic value and arranged between said specific bit set at said second logic value and said first set of bits.

13. The method according to claim 7, wherein the encoding of said sequence of repetitive data is carried out using also one or more words with a format for compressible data specific for encoding a sequence of zeros, a word with said specific format for compressible data being made up of a set of bits in which a first specific bit and a second specific bit are set at said second logic value, and the remaining bits are represented by the number of repetitions of said zeros in said sequence of zeros.

14. The method according to claim 13, wherein said first specific bit and said second specific bit are the two most significant bits of said word.

15. A method for compressing repetitive data, comprising:
recognizing a sequence of repetitive data;
encoding the recognized sequence of repetitive data into a combination of compressible data words and non-compressible data words,
wherein each of the non-compressible data words includes a plurality of bits, with at least one bit identifying the word as a non-compressible data word and a group of bits representing non-compressible data represented by the word; and wherein each of the compressible data words includes,
a plurality of bits, at least one bit identifying the word as a compressible data word,
a first group of bits indicating a total number of subsequent words that define a repetitive sequence within the data and which together with the word encode that sequence of repetitive data, and
a second group of bits indicating the number of times that the repetitive sequence defined by the first group of bits is repeated.

16. The method of claim 15 wherein a most significant bit of each non-compressible and compressible data word identifies the word as either a non-compressible or compressible data word.

17. The method of claim 15 wherein each compressible data word further includes, as part of the at least one bit identifying the word as a compressible data word, at least one bit identifying the word encoding bits having a first logic value, and wherein the remaining bits have a value indicating the number of bits having the first logic value that are being encoded.

18. An electronic system, comprising:
a functional device; and
a tester coupled to the functional device and operable in combination with the functional device to recognize a sequence of repetitive data from the functional device and to encode the sequence into a combination of compressible data words and non-compressible data words,
each non-compressible data word including a plurality of bits, with at least one bit identifying the word as a non-compressible data word and a group of bits representing non-compressible data represented by the word, and
each compressible data word including a plurality of bits,
at least one bit identifying the word as a compressible data word,
a first group of bits indicating a total number of subsequent words that define a repetitive sequence within the data and which together with the word encode that sequence of repetitive data, and
a second group of bits indicating the number of times that the repetitive sequence defined by the first group of bits is repeated.

19. The electronic system of claim 18 wherein the system comprises a memory test system and wherein the tester comprises a memory tester and the functional device comprises a memory device.

20. The electronic system of claim 19 wherein the memory device comprises an embedded memory device including a processor.

21. The electronic system of claim 20 wherein the processor in the embedded memory device recognizes the sequence of repetitive data from the functional device and encodes the sequence into a combination of compressible data words and non-compressible data words, and provides these data words to the tester.

22. The electronic system of claim 19 further comprising a workstation coupled to the tester, and wherein the memory tester provides to the workstation over a communications link the compressible data words and non-compressible data words corresponding to an encoded version of the recognized sequence of repetitive data.

* * * * *